United States Patent [19]

Kubo et al.

[11] Patent Number: 5,081,431
[45] Date of Patent: Jan. 14, 1992

[54] DIGITAL TEMPERATURE-COMPENSATED OSCILLATOR

[75] Inventors: Kuichi Kubo; Tsutomu Yamakawa; Hiroshi Yoshida, all of Tokyo, Japan

[73] Assignee: Nihon Dempa Kogyo Co., Ltd., Tokyo, Japan

[21] Appl. No.: 644,614

[22] Filed: Jan. 23, 1991

[30] Foreign Application Priority Data

Jan. 26, 1990 [JP] Japan ................................. 2-16435
Jan. 31, 1990 [JP] Japan ................................. 2-20970

[51] Int. Cl.$^5$ ........................... H03B 5/32; H03L 1/02
[52] U.S. Cl. .................... 33/158; 331/116 R; 331/176
[58] Field of Search ................ 331/158, 176, 116 R, 331/116 FE

[56] References Cited

U.S. PATENT DOCUMENTS

| | | | |
|---|---|---|---|
| 4,616,173 | 10/1986 | Cook et al. | 331/176 X |
| 4,633,422 | 12/1986 | Brauer | 331/176 X |
| 4,646,035 | 2/1987 | Chapelle | 331/176 X |
| 4,949,055 | 8/1990 | Leitl | 331/158 |

FOREIGN PATENT DOCUMENTS 62-18828 1/1987 Japan.

*Primary Examiner*—Siegfried H. Grimm
*Attorney, Agent, or Firm*—Frishauf, Holtz, Goodman & Woodward

[57] ABSTRACT

A digital temperature-compensated oscillator comprises a crystal oscillator, a first memory previously storing digital temperature compensation data obtained by previously measuring the relation between the ambient temperatures and the frequency deviations of the crystal oscillator, a second memory for storing frequency offset amounts of the oscillation frequency of the crystal oscillator, a temperature sensor for outputting analog detection data relating to the ambient temperature, an A/D converter for converting the analog detection data to digital detection data, a readout circuit for reading out temperature compensation data corresponding to the digital detection data and stored in the first memory according to the digital detection data and reading out the frequency offset amount stored in the second memory according to the digital detection data, an operation circuit for effecting the following calculation by use of the readout temperature compensation data and readout frequency offset amount to derive digital control voltage, $$V_c = V_{co} + (K_{00} + V_{co}K_{10} + K_{01}T) \times (\Delta F + \Delta F^2 \times K_{10}/2)$$

where $K_{00}$, $K_{01}$ and $K_{10}$ are constants, $V_{co}$ is an initial value of the control voltage, T is an ambient temperature and $\Delta F$ is a frequency offset amount, a D/A converter for converting the digital control voltage into an analog control voltage, and a voltage-capacitance converter for receiving the analog control voltage and generating a control signal to be supplied to the crystal oscillator according to the received analog control voltage, wherein the frequency of the crystal oscillator is controlled according to the control signal.

5 Claims, 7 Drawing Sheets

F I G. 11
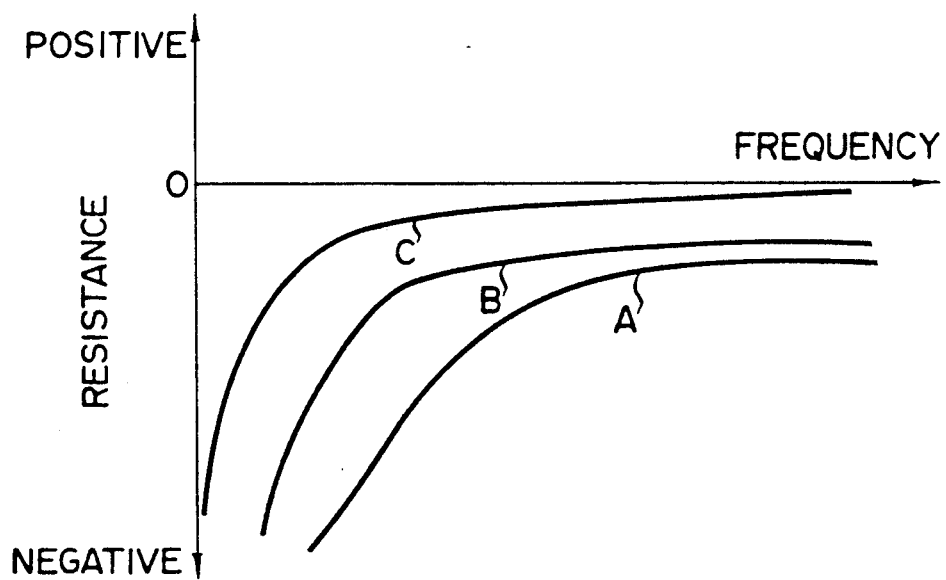
F I G. 12

DIGITAL TEMPERATURE-COMPENSATED OSCILLATOR

BACKGROUND OF THE INVENTION

1. Field of the Invention

This invention relates to a digital temperature-compensated oscillator for compensating variation in the oscillation frequency caused by variation in temperature.

2. Description of the Related Art

Recently, a crystal oscillator is widely used as a reference of frequency, time and the like. In general, a crystal unit used for the crystal oscillator has a temperature coefficient and the frequency thereof varies with variation in temperature. For example, a general crystal unit of AT-cut used in a frequency range of several MHz to several ten MHz has a temperature coefficient of substantially cubic curve. The characteristic minutely varies according to the angle of cut and the inflection point thereof occurs at or near 25° C.

As the precision of the electronic device becomes higher, the crystal oscillator is required to have more stable oscillation frequency. In order to meet the requirement, the crystal oscillator may be placed into a thermostatic chamber. However, when the thermostatic chamber is used, the whole size becomes larger and larger power consumption for keeping the temperature in the thermostatic chamber constant is required. Further, after the power source is turned on, it takes a long time to set the oscillation frequency stable. In addition, since parts of the crystal oscillator are exposed to relatively high temperatures of approx. 70° C., high reliability may not be attained.

Further, there is provided a crystal oscillator in which a crystal unit is connected to a temperature detector and a capacitance circuit such as a thermistor paralleled with a capacitor and temperature compensation is effected according to variation in the reactance of the thermistor circuit. However, the frequency stability of this type of crystal unit is less than 1/10 of the frequency stability of the crystal unit using the thermostatic chamber.

In order to solve the above problem, a digital temperature-compensated oscillator having the construction as shown in FIG. 1 has been developed, for example. In this oscillator, a detection output of a temperature sensor 1 is supplied to a compensation voltage generating circuit 2 to generate temperature compensation voltage $V_{co}(T)$. The temperature compensation voltage $V_{co}(T)$ is added to frequency compensation voltage $V_f$ supplied to a frequency adjusting terminal 3 to derive control voltage $V_c(T)$.

The frequency compensation voltage $V_f$ is used to adjust the oscillation frequency so as to compensate for deviation of an actual oscillation frequency from the reference frequency caused by aging or the like.

The temperature compensation voltage $V_{co}(T)$ obtained through a resistor $R_1$ and the frequency compensation voltage $V_f$ obtained through a resistor $R_2$ are added together to make the control voltage $V_c(T)$.

The control voltage $V_c(T)$ is applied to a variable-capacitance diode 7 series-connected with a crystal unit 6 of a Colpitts crystal oscillator, for example, to finely adjust the oscillation frequency and keep the oscillation frequency at a constant frequency.

The control voltage $V_c(T)$ is given by the following equation.

$$V_c(T) = A \times V_{co}(T) + B \times V_f \qquad (1)$$

where $A = R_2/(R_2 + R_2)$ and $B = R_1/(R_1 + R_2)$

However, the amount of variation in the frequency for voltage applied to the variable-capacitance diode in this type of oscillator generally becomes nonlinear as shown in FIG. 2, for example. For example, a frequency offset value $\Delta F_1$ caused when the control voltage $V_{c1}$ is changed by an infinitesimal amount $\Delta V_c$ and a frequency offset value $\Delta F_2$ caused when the control voltage $V_{c2}$ is changed by an infinitesimal amount $\Delta V_c$ are different from each other. Further, the amount of variation in frequency caused when the control voltage $V_c$ is changed by a constant amount may be influenced by temperature.

For this reason, for example, even if the control voltage $V_c$ is finely adjusted at a constant temperature to cause a constant offset $\Delta F$ in the oscillation frequency, the frequency offset value $\Delta F$ cannot be kept constant in a wide temperature range.

FIG. 3 is a graph showing real measurements of the ratio $\Delta F/F$ of the frequency offset $\Delta F$ to the reference frequency F obtained when the temperature is changed from $-20°$ C. to $+70°$ C. after the offset value $\Delta F$ was respectively set to 0 PPM, +2 PPM, −2 PPM, +4 PPM, and −4 PPM at a temperature of 70° C. in the crystal oscillator shown in FIG. 1. As is clearly seen from the result, since the specified frequency offset $\Delta F$ varies according to variation in temperature, the frequency offset cannot be kept at a constant value. In particular, the amount of variation in the offset becomes larger in a low temperature range.

Further, since the compensation characteristic by the temperature compensation voltage $V_{co}(T)$ is influenced when the frequency compensation voltage $V_f$ is made variable, correct temperature compensation cannot be attained.

SUMMARY OF THE INVENTION

An object of this invention is to provide a digital temperature-compensated oscillator capable of keeping a constant amount of frequency offset in a wide temperature range irrespective of the set value of the frequency offset.

In order to attain the above object, a digital temperature-compensated oscillator of this invention comprises:

a crystal oscillator;

first memory means previously storing digital temperature compensation data obtained by previously measuring the relation between the ambient temperatures and the frequency deviations of the crystal oscillator;

second memory means for storing frequency offset amounts of the oscillation frequency of the crystal oscillator;

a temperature sensor for outputting analog detection data relating to the ambient temperature;

A/D converting means for converting the analog detection data to digital detection data;

readout means for reading out temperature compensation data corresponding to the digital detection data and stored in the first memory means according to the digital detection data and reading out the frequency offset amount stored in the second memory means according to the digital detection data;

operation means for effecting the following operation by use of the readout temperature compensation data and readout frequency offset amount to derive digital control voltage, $$V_c = V_{\infty} + (K_{00} + V_{\infty}K_{10} + K_{01}T) \times (\Delta F + \Delta F^2 \times K_{10}/2\ 2)$$

where $K_{00}$, $K_{01}$ and $K_{10}$ are constants, $V_{\infty}$ is an initial value of the control voltage, T is an ambient temperature and $\Delta F$ is a frequency offset amount;

D/A converting means for converting the digital control voltage into an analog control voltage; and voltage-capacitance converting means for receiving the analog control voltage and generating a control signal to be supplied to the crystal oscillator according to the received analog control voltage; wherein the frequency of the crystal oscillator is controlled according to the control signal.

According to a preferable aspect of this invention, the digital temperature-compensated oscillator further comprises:

container means for hermetically receiving the crystal oscillator, first memory means, second memory means, temperature sensor, A/D converting means, readout means, operation means, D/A converting means and voltage-capacitance converting means; and changing means provided on the container means, for changing the frequency offset amount of the second memory means from the exterior.

According to a further preferable aspect of the digital temperature-compensated oscillator of this invention, the changing means is a terminal mounted on the container means and the frequency offset amount is changed by changing a voltage applied to the terminal.

According to a preferable aspect of the digital temperature-compensated oscillator of this invention, the changing means includes increasing switching means for increasing the frequency offset amount and decreasing switching means for decreasing the frequency offset amount.

Further, according to a preferable aspect of the digital temperature-compensated oscillator of this invention, the crystal oscillator includes:

a crystal unit having first and second electrodes;

an inverter circuit provided between the first and second electrodes of the crystal oscillator and having input and output terminals, the input terminal of the inverter circuit being connected to the first electrode of the crystal unit; and resistor means provided between the output terminal of the inverter circuit and the second electrode of the crystal unit, for limiting a current flowing in the crystal unit; wherein an oscillation signal is output from a node between the resistor means and the second electrode of the crystal unit.

Additional objects and advantages of the invention will be set forth in the description which follows, and in part will be obvious from the description, or may be learned by practice of the invention. The objects and advantages of the invention ma be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a diagram showing a crystal current waveform of the conventional crystal oscillator; and FIG. 12 is a diagram showing the relation between the resistance value and the frequency of the crystal oscillator shown in FIG. 9.

DETAILED DESCRIPTION OF THE PREFERRED EMBODIMENTS

Figure 4:
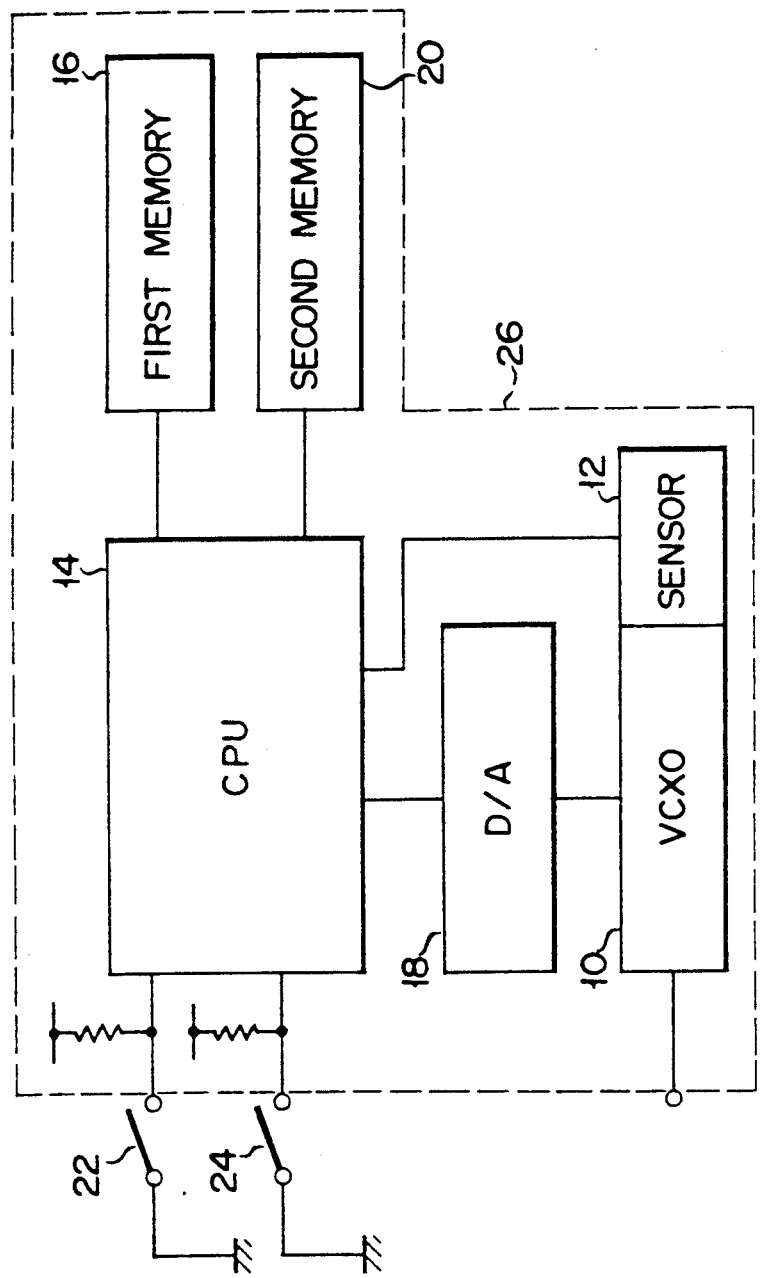
FIG. 4 is a block diagram of a digital temperature-compensated oscillator according to this invention.

There will now be described an embodiment of a digital temperature-compensated oscillator according to this invention with reference to FIG. 4.

A voltage-controlled crystal oscillator (which is hereinafter referred to as a VCXO) 10 can change the oscillation frequency according to a control voltage applied thereto. A temperature sensor 12 is mounted in position adjacent to the VCXO 10 in order to measure ambient temperatures of the VCXO 10.

The temperature sensor 12 is a diode whose forward voltage varies with temperature, for example, and converts the detected temperature into a digital value and then supplies the same to a one-chip microprocessor (which is hereinafter referred to as a CPU) 14 which stores a preset program. The CPU 14 reads out temperature compensation data designated by a corresponding address of a first memory 16 in response to a signal from the temperature sensor 12. The first memory 16 is an ultra violet erasable memory, for example. In a case where only temperature compensation data is read out, the readout temperature compensation data is supplied to a digital/analog converter 18 and is converted into an analog signal. An analog output of the digital/analog converter 18 is supplied to the VCXO 10 and is subjected to temperature compensation.

Figure 1:
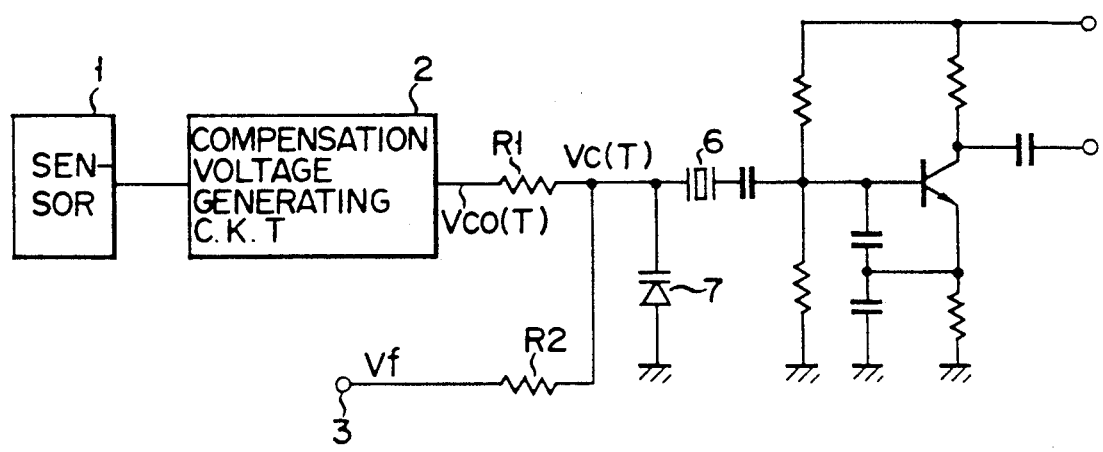
FIG. 1 is a block diagram of a conventional temperature-compensated oscillator.
Figure 2:
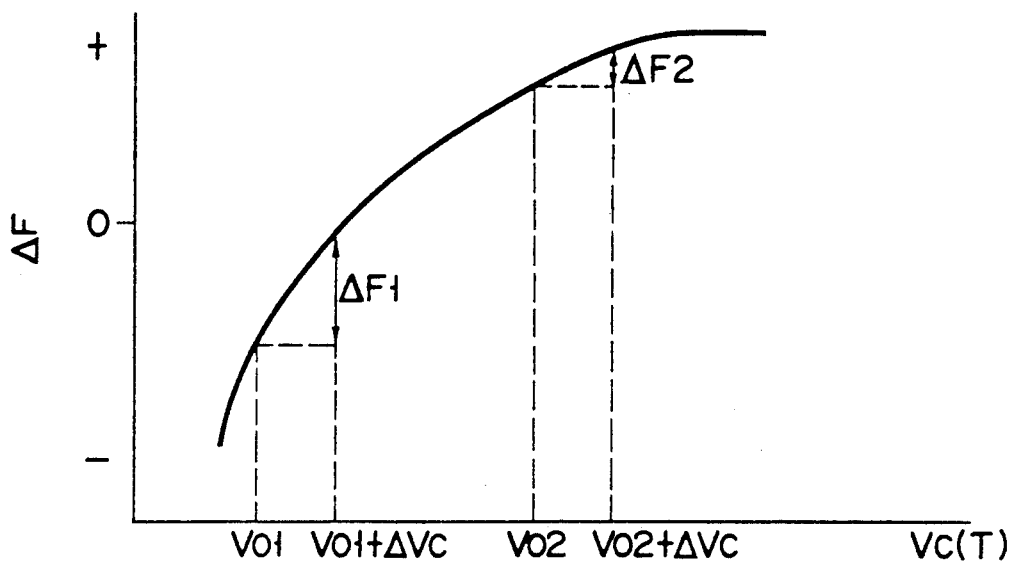
FIG. 2 is a diagram showing the relation between the frequency variation and the control voltage of the conventional temperature-compensated oscillator.
Figure 3:
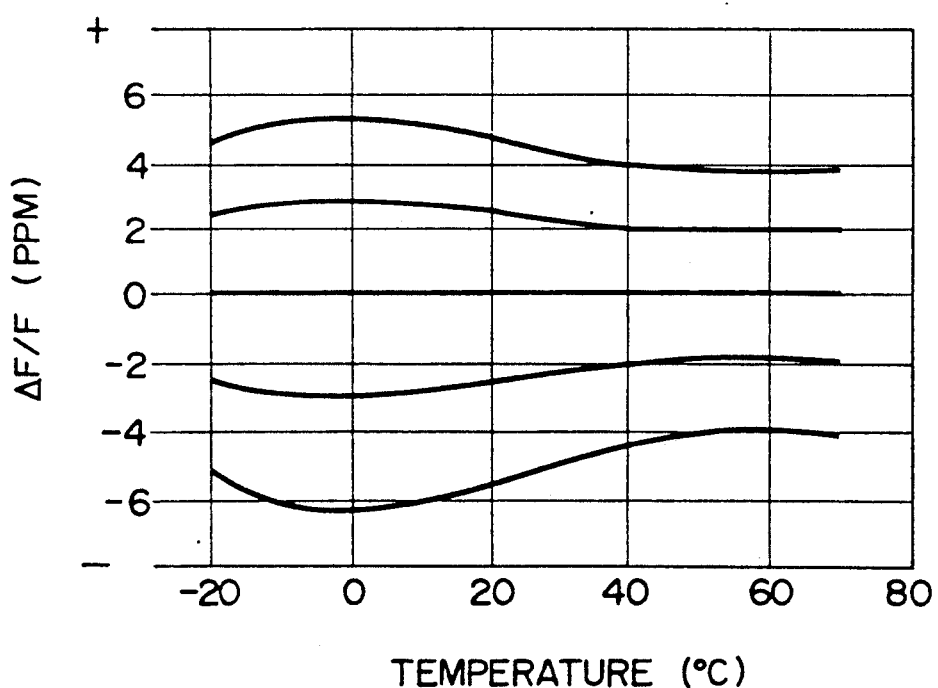
FIG. 3 is a diagram showing the relation between the variation rate of the oscillation frequency and temperature when a constant offset voltage is applied in the temperature-compensated oscillator of FIG. 1.

Offset data $\Delta F$ which permits an oscillation output of the VCXO 10 to be changed by a constant amount is stored in, for example, an electrically erasable type second memory 20. The CPU 14 reads out offset data from the second memory 20. In a case where temperature compensation data and offset data ΔF are read out by the CPU 14, the CPU 14 effects the predetermined calculation based on the readout temperature compensation data and offset data, and the result is supplied to the D/A converter 18. The D/A converter 18 converts the digital data supplied thereto into analog control voltage Vc. The control voltage Vc is supplied to a voltage-capacitance converting element such as a variable-capacitance diode for controlling the oscillation frequency of the VCXO 10 so as to change the electrostatic capacitance of the variable-capacitance diode. For example, as shown in FIG. 1, the voltage-capacitance converting element is series-connected with the crystal unit of a Colpitts crystal oscillator so that the oscillation frequency thereof may be minutely changed according to variation in the electrostatic capacitance of the voltage-capacitance converting element.

The states of the contacts of the frequency increasing switch 22 and frequency decreasing switch 24 are read by the CPU 14. For example, each time the contacts close, the content of the second memory 20 or offset value is increased or decreased by a constant amount.

Figure 5:
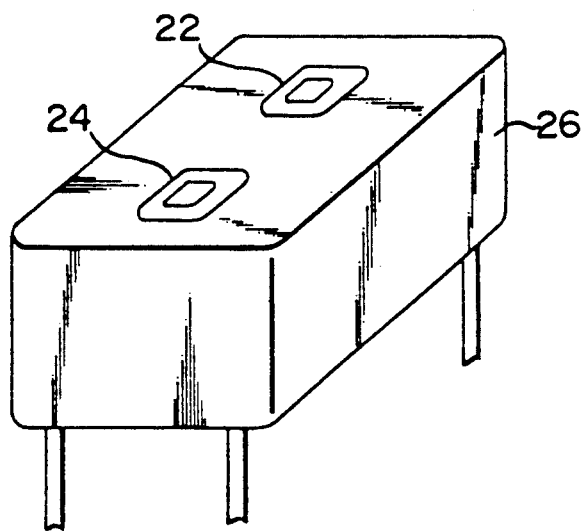
FIG. 5 is a perspective view of the digital temperature-compensated oscillator according to this invention.

Further, the VCXO 10, temperature sensor 12, CPU 14, D/A converter 18, and first and second memories 16 and 20 are received in a hermetically sealed container 26 made of metal as shown in FIG. 5. The switches 22 and 24 are mounted on the hermetically sealed container 26 and can be operated from the exterior.

With the above construction, when the VCXO 10 is operated, the temperature is detected by the temperature sensor 12. The detected data is received by the CPU 14. The CPU 14 reads out temperature compensation data corresponding to the received temperature data from the first memory, adds offset data read out from the second memory 20 to the readout temperature compensation data and then supplies the result of addition to the digital/analog converter 18. The digital/analog converter 18 converts a digital value supplied thereto into an analog value and supplies the same to the VCXO 10 as a control voltage so as to compensate for the oscillation frequency.

Next, the operation effected by the CPU 14 is explained. Assume now that the oscillation frequency is changed by a small frequency amount df. In order to cause a small amount df of frequency variation, it is necessary to change the control voltage Vc by a small variation amount dVc. In this case, the dVc/df is not constant and can be expressed as a function of the control voltage Vc and temperature T by the following equation (2).

$$dVc/df = f(Vc, T) \quad (2)$$

The equation (2) can be rewritten to derive the following equation (3).

$$dVc/f(Vc, T) = df \quad (3)$$

The following equation (4) can be obtained by integrating the equation (3) from the state (Vc=Vco, ΔF=0) which is set before the adjustment of the frequency to the state set after the frequency offset of ΔF is made.

$$\Delta F = \int_{Vco}^{Vc} dVc/f(Vc, T) \quad (4)$$

The right side of the equation (4) is a function of the control voltage Vc and temperature T, and if the equation (4) is rewritten to derive Vc, Vc becomes a function of Vco, T and ΔF. That is, the control voltage Vc can be generally expressed by the following equation (5).

$$Vc = Vco + \Sigma\Sigma\Sigma A_{kji} Vco^k T^j \Delta F^i \quad (5)$$

If the second term of the right side of the equation (5) is added to the control voltage, then the frequency offset ΔF can be kept constant irrespective of variation in temperature even when the frequency offset amount is changed.

However, in order to effect the temperature compensation strictly based on the equation (5), it becomes necessary to effect an excessively large amount of calculations and it is not practical.

Figure 6:
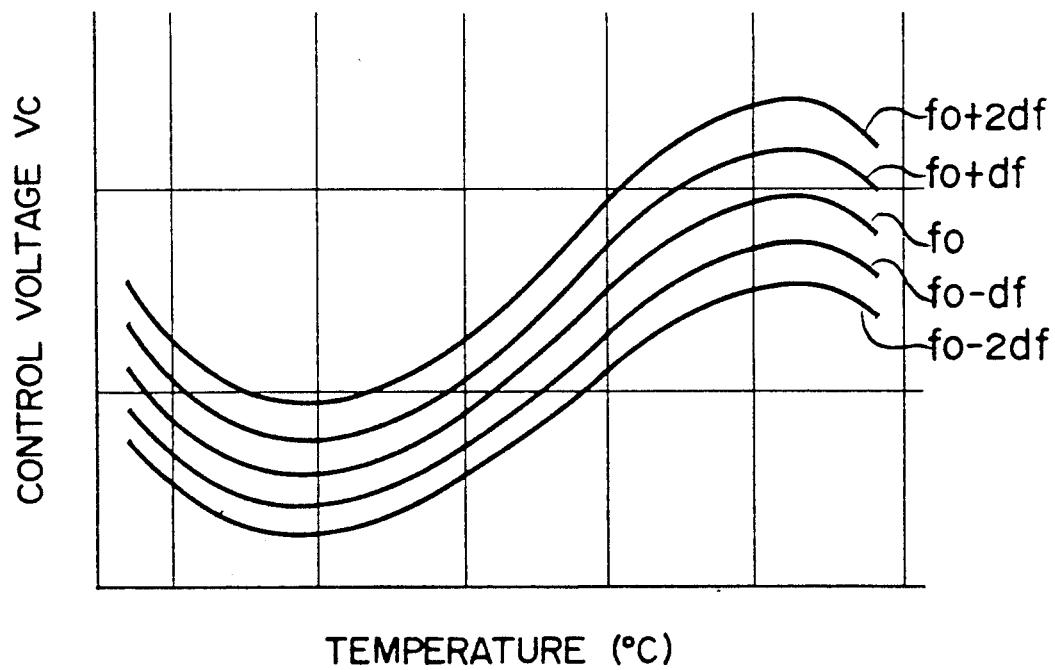
FIG. 6 is a graph showing the measurement result of the temperature dependency of control voltage necessary for obtaining constant frequency offset.

Therefore, in order to determine the function f(Vc, T) in the equation (2), the control voltage Vc which permitted the oscillation frequency $f_0$ to be kept constant was measure in the entire temperature range in which temperature compensation must be made. Next, the control voltage (Vc+dVc) which permitted the oscillation frequency $f_0$ to be kept at a frequency ($f_0$+df) which is offset by a small constant frequency amount df was measured in the entire temperature range. FIG. 6 is a graph showing an example of the result of measurements.

It was experimentally proved that the equation (2) could be approximated by a first-order approximation for the control voltage Vc and temperature T with a sufficiently high precision in a case where the frequency stability of ±0.1 PPM was set as a target value. In this case, dVc/df can be obtained by the following equation (6).

$$dVc/df = K_{00} + K_{10}Vc + K_{01}T \quad (6)$$

where $K_{00}$, $K_{10}$ and $K_{01}$ are constants.

Therefore, the control voltage Vc can be derived by the following equation (7) based on the equation (6).

$$Vc = \{Vco + (K_{00} + K_{01}T)/K_{10}\} \times exp(K_{10}\Delta F) - (K_{00} + K_{01}T)/K_{10} \quad (7)$$

If the frequency offset ΔF is not excessively large, $|K_{10}\Delta F|$ becomes extremely smaller than 1. Therefore, the first and second-order terms of Taylor series obtained by subjecting exp($K_{10}\Delta F$) to Taylor expansion can be used as sufficient approximation without causing practical problem. As a result, the following equation (8) can be obtained.

$$exp(K_{10}\Delta F) = 1 + K_{10}\Delta F + (\tfrac{1}{2})(K_{10}\Delta F)^2 \quad (8)$$

The following equation (9) can be obtained by substituting the equation (8) into the equation (7).

$$Vc = Vco + (K_{00} + Vco K_{10} + K_{01}T)(\Delta F + \Delta F^2 \times K_{10}/2) \quad (9)$$

The control voltage Vc obtained by the equation (9) is supplied to the digital/analog converter and is converted into an analog signal which is in turn supplied to the voltage-capacitance converting element for temperature compensation.

Next, the temperature compensation is explained in more detail.

The control voltage Vc which permitted the frequency offset to be kept constant in a preset temperature range in the oscillator having an oscillation frequency of 12.8 MHz was measured and the result of the measurements proved that the constants in the equation (9) were set as follows.

$$K_{00} = 4.286 \times 10^{-3} \text{ (V/Hz)}$$

$$K_{10} = 2.627 \times 10^{-3} \text{ (1/Hz)}$$

$$K_{01} = -8.026 \times 10^{-6} \text{ (V/Hz/°C.)}$$

The error between the value obtained by substituting the constants into the equation (6) and the actually measured value was $7.48 \times 10^{-5}$ (V/Hz) and a sufficiently practical approximation could be obtained.

Figure 7:
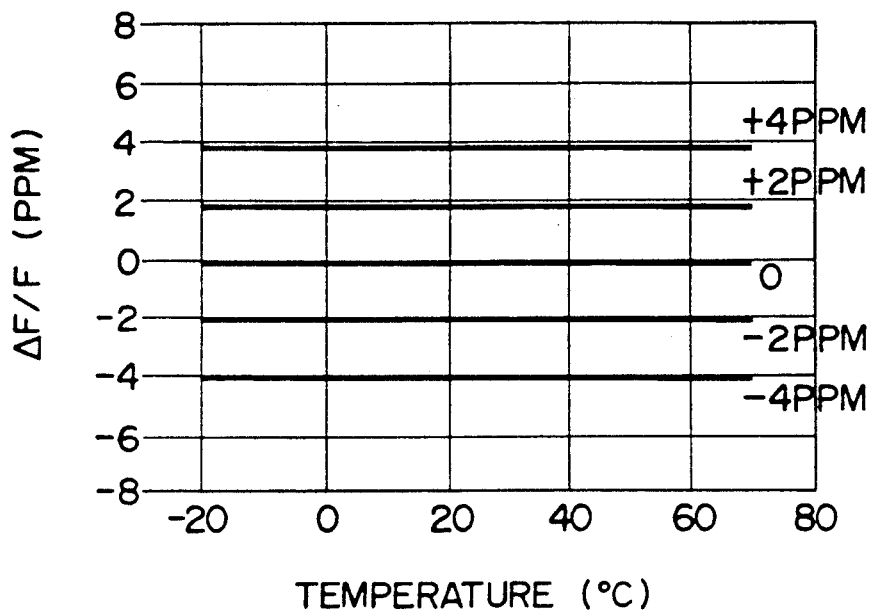
FIG. 7 is a diagram showing the temperature dependency of oscillation frequency in the digital temperature-compensated oscillator according to this invention.

FIG. 7 shows the variation rate of measurements of oscillation frequency obtained when the temperature was changed from −20° C. to +70° C. after the frequency offsets ΔF of 0 PPM, +2 PPM, −2 PPM, +4 PPM and −4 PPM were set at a normal temperature in the temperature-compensated oscillator for attaining temperature compensation by effecting the above operations. As is clearly understood from the result of measurements, a constant offset amount can be kept in a preset temperature range without affecting the temperature compensation characteristic.

Offset data can be easily changed from the exterior by using a simple element by setting the main components into the hermetically sealed container and mounting a switch for increasing or decreasing offset data as described in the above embodiment. Therefore, even when the frequency of the temperature-compensated oscillator is changed by aging, the center frequency can be easily adjusted. Further, since the main components are set inside the hermetically sealed container and influence of the environment such as moisture outside the hermetically sealed container can be eliminated, variation in the center frequency by aging can be reduced.

Figure 8:
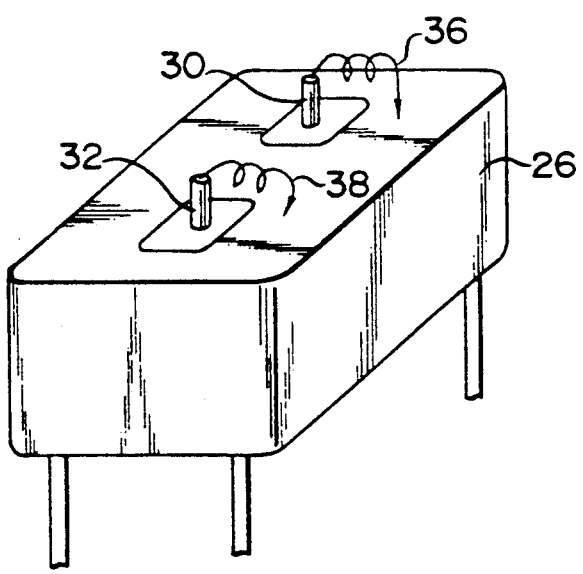
FIG. 8 is a perspective view of another embodiment of a digital temperature-compensated oscillator according to this invention.

As shown in FIG. 8, it is also possible to change offset data in a manner different from that of the above embodiment by forming terminals 30 and 32 on the hermetically sealed container 26 and short-circuiting the terminals 30 and 32 to the container 26 via suitable conductive wires 36 and 38. The first and second memories may be provided by dividing the same memory into two portions.

Figure 9:
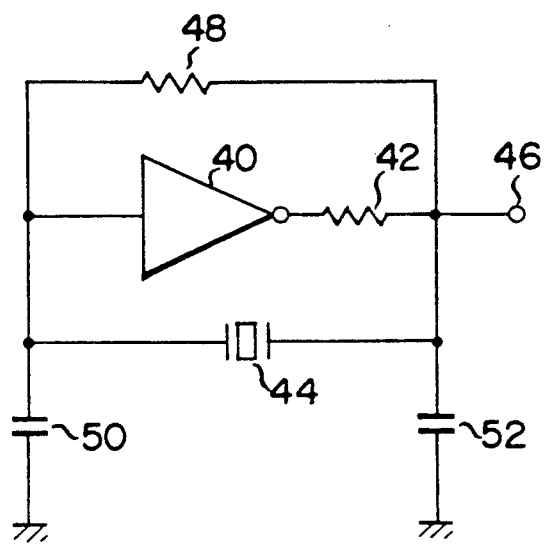
FIG. 9 is a diagram showing another example of a voltage-controlled crystal oscillator used in this invention.

Next, anther example of the crystal oscillator used in the VCXO 10 is explained with reference to FIG. 9. The crystal oscillator is used instead of the Colpitts crystal oscillator shown in FIG. 1 and is called an inverter oscillation circuit.

The output terminal of an inverter 40 is connected to one end of a resistor 42 for limiting the crystal current flowing in a crystal unit 44. The resistance of the resistor 42 is set in a range of several hundred Ω to less than 20 kΩ and used to adjust the crystal current flowing in the crystal unit 44 to a proper value. The crystal unit 44 is connected between the other end of the resistor 42 and the input terminal of the inverter 40. The other input terminal of the resistor 42 is connected to an output terminal 46 and a feedback resistor 48 is connected between the output terminal 46 and the input terminal of the inverter 40. The resistance of the feedback resistor 48 is different for each oscillation frequency of the crystal unit 44 and is generally set to several hundred kΩ to several MΩ. The input terminal of the inverter 40 and the other end of the resistor 42 are grounded via respective capacitors 50 and 52. The capacitances of the capacitors 50 and 52 are set to several pF to less than 200 pF. The input terminal of the inverter 40 is connected to a variable-capacitance diode of FIG. 1 via a capacitor.

Figure 10:
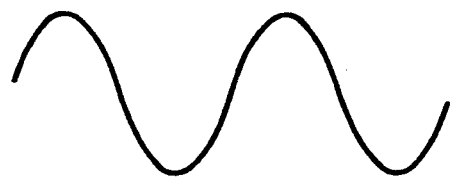
FIG. 10 is a diagram showing a crystal current waveform of the crystal oscillator shown in FIG. 9.

With the above construction, since the current flowing in the crystal unit 44 can be limited by use of the resistor 42 even when the high-speed inverter 40 is used, a crystal current waveform having no distortion and containing no harmonics as shown in FIG. 10 can be obtained. As a result, no jump occurs in the temperature characteristic and the frequency can be kept at a constant value for variation in temperature.

If a high-speed inverter is used in the crystal oscillator in which the resistor 42 is removed, overtone components tend to occur in the crystal current waveform as shown in FIG. 11 and the waveform is distorted, thereby causing jumps to occur in the temperature characteristic of the oscillation frequency.

When the resistor 42 is connected to the output of the inverter 40 as in the above embodiment, the relation between the frequency and negative resistance as shown in FIG. 12 can be obtained and a region in which the negative resistance occurs can be shifted towards the low frequency range.

That is, in FIG. 12, a curve A shows a characteristic of an oscillation circuit in which the resistor 42 is not used, a curve B shows a characteristic of an oscillation circuit having the resistor 42 of relatively small resistance (approx. 2 kΩ) and a curve C shows a characteristic of an oscillation circuit having the resistor 42 of relatively large resistance (approx. (15 kΩ). As is clearly understood from the characteristics, the negative resistance in the high frequency range of the oscillation circuit can be suppressed when the resistor 42 of relatively large resistance is used, and as a result, the overtone resonance can be suppressed, thus making it possible to obtain an oscillation output of fundamental frequency without fail.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A digital temperature-compensated oscillator comprising:
   a crystal oscillator;
   first memory means previously storing digital temperature compensation data obtained by previously measuring a relation between an ambient temperatures and frequency deviations of said crystal oscillator;
   second memory means for storing frequency offset amounts of an oscillation frequency of said crystal oscillator;

a temperature sensor for detecting the ambient temperature and outputting analog detection data relating to the ambient temperature;

A/D converting means for converting the analog detection data to digital detection data;

readout means for reading out temperature compensation data corresponding to the digital detection data and stored in said first memory means according to the digital detection data and reading out the frequency offset amount stored in said second memory means according to the digital detection data;

operation means for effecting the following calculation by use of the readout temperature compensation data and readout frequency offset amount to derive digital control voltage, $$Vc = V_{co} + (K_{00} + V_{co}K_{10} + K_{01}T) \times (\Delta F + \Delta F^2 \times K_{10}/2)$$

where $K_{00}$, $K_{01}$ and $K_{10}$ are constants, $V_{co}$ is an initial value of the control voltage, T is an ambient temperature and $\Delta F$ is a frequency offset amount;

D/A converting means for converting the digital control voltage into an analog control voltage; and voltage-capacitance coverting means for receiving the analog control voltage and generating a control signal to be supplied to said crystal oscillator according to the received analog control voltage; wherein the frequency of said crystal oscillator is controlled according to the control signal.

2. A digital temperature-compensated oscillator according to claim 1, further comprising:

container means for hermetically receiving said crystal oscillator, first memory means, second memory means, temperature sensor, A/D converting means, readout means, operation means, D/A converting means and voltage-capacitance converting means; and changing means provided on said container means, for changing the frequency offset amount of said second memory mean from the exterior.

3. A digital temperature-compensated oscillator according to claim 2, wherein said changing means is a terminal mounted on said container means and the frequency offset amount is changed by changing a voltage applied to said terminal.

4. A digital temperature-compensated oscillator according to claim 2, wherein said changing means includes increasing switching means for increasing the frequency offset amount and decreasing switching means for decreasing the frequency offset amount.

5. A digital temperature-compensated oscillator according to claim 1, wherein said crystal oscillator includes:

a crystal unit having first and second electrodes;

an inverter circuit provided between the first and second electrodes of said crystal unit and having input and output terminals, the input terminal of said inverter circuit being connected to the first electrode of said crystal unit; and resistor means provided between the output terminal of said inverter circuit and the second electrode of said crystal unit, for limiting a current flowing in said crystal unit; wherein an oscillation signal is output from a node between said resistor means and the second electrode of said crystal unit.

* * * * *